(12) United States Patent
Tuominen

(10) Patent No.: US 10,651,215 B2
(45) Date of Patent: May 12, 2020

(54) SENSOR SYSTEM

(71) Applicant: AT&S Austria Technologie & Systemtechnik Aktiengesellschaft, Leoben (AT)

(72) Inventor: Mikael Tuominen, Shanghai (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/852,420

(22) Filed: Dec. 22, 2017

(65) Prior Publication Data
US 2018/0182796 A1    Jun. 28, 2018

(30) Foreign Application Priority Data

Dec. 23, 2016 (CN) .......................... 2016 1 1206580

(51) Int. Cl.
*H01L 27/146* (2006.01)
*H04N 5/225* (2006.01)
*H04N 5/3745* (2011.01)

(52) U.S. Cl.
CPC .... *H01L 27/14618* (2013.01); *H01L 27/1469* (2013.01); *H01L 27/14627* (2013.01); *H01L 27/14634* (2013.01); *H01L 27/14636* (2013.01); *H01L 27/14685* (2013.01); *H04N 5/2253* (2013.01); *H04N 5/2254* (2013.01); *H04N 5/2257* (2013.01); *H04N 5/3745* (2013.01)

(58) Field of Classification Search
CPC ......... H01L 27/14618; H01L 27/14627; H01L 27/14625; H01L 27/14634; H01L 27/14636; H01L 27/14685; H01L 27/1469; H04N 5/2253; H04N 5/2257; H04N 5/2254
See application file for complete search history.

(56) References Cited

U.S. PATENT DOCUMENTS

| 2003/0071342 A1* | 4/2003 | Honda | H01L 27/14618 257/687 |
| 2005/0116138 A1* | 6/2005 | Hanada | H01L 24/97 250/206 |
| 2006/0202318 A1* | 9/2006 | Satou | H01L 27/14618 257/686 |
| 2010/0230148 A1* | 9/2010 | Kariya | H01L 23/13 174/258 |

(Continued)

FOREIGN PATENT DOCUMENTS

| CN | 1601752 A | 3/2005 |
| CN | 1832163 A | 9/2006 |

(Continued)

OTHER PUBLICATIONS

Chen, Shan, Office Action in Application 2016112065805, dated Dec. 18, 2019, pp. 1-7, China National Intellectual Property Administration.

*Primary Examiner* — Mohammed Shamsuzzaman
*Assistant Examiner* — Aaron J Gray
(74) *Attorney, Agent, or Firm* — Robert A. Blaha; Smith Temple Blaha LLC

(57) ABSTRACT

The present invention relates to a sensor system. The sensor system comprises a component carrier and a sensor having a control unit and a sensor unit. At least a part of the sensor unit is located within the component carrier.

17 Claims, 4 Drawing Sheets

(56) References Cited

U.S. PATENT DOCUMENTS

| | | | |
|---|---|---|---|
| 2012/0242876 A1* | 9/2012 | Hagiwara | H01L 27/14618 348/294 |
| 2014/0240559 A1* | 8/2014 | Ueno | H04N 5/335 348/294 |
| 2014/0252794 A1 | 8/2014 | Lin et al. | |
| 2014/0253794 A1 | 9/2014 | Miyazaki et al. | |
| 2014/0334601 A1* | 11/2014 | Shizukuishi | H01L 27/14661 378/62 |

FOREIGN PATENT DOCUMENTS

| | | |
|---|---|---|
| JP | 2003078122 A | 3/2003 |
| JP | 2007165460 A | 6/2007 |
| JP | 2011147182 A | 7/2011 |
| JP | 2011233716 A | 11/2011 |
| KR | 20100099932 A | 9/2010 |
| KR | 10-2011-0014797 A | 2/2011 |
| KR | 10-1032725 B1 | 5/2011 |

* cited by examiner

SENSOR SYSTEM

CROSS-REFERENCE TO RELATED APPLICATION

This application claims the benefit of the filing date of the Patent Application in China, assigned number 201611206580.5, filed 23 Dec. 2016, the disclosure of which is hereby incorporated herein by reference.

TECHNICAL FIELD

The invention relates to a sensor system, in particular a camera, and to a method of manufacturing a sensor system.

TECHNOLOGICAL BACKGROUND

Conventionally, sensor modules and in particular camera modules, become more and more important in the field of integrated circuit technology. Conventionally, sensor modules are normally placed on printed circuit boards (PCB) for example with a socket connection during a final assembly step of the PCB. Hence, the sensor modules are arranged on a top surface of the PCB and hence protrude from the surface of the PCB. However, conventional sensor modules may suffer from a limited reliability.

SUMMARY

There may be a need to provide a robust sensor system which has a high reliability.

According to a first aspect of the present invention, a sensor system (in the field of integrated circuit technology) is presented. The sensor system comprises a component carrier and a sensor having a control unit and a sensor unit. At least a part of the sensor unit is located within the component carrier.

According to a further aspect of the present invention, a method of manufacturing a sensor system (e.g. as described above) is presented. According to the method, a component carrier and a sensor having a control unit and a sensor unit are provided. At least a part of the sensor unit is located within the component carrier.

OVERVIEW OF EMBODIMENTS

In the context of the present application, the term "component carrier" may particularly denote any support structure which is capable of accommodating one or more electronic components, in particular the described sensor, thereon and/or therein for providing both mechanical support and electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above mentioned types of component carriers. Exemplary embodiments of the component carrier are described further below.

The sensor comprises a control unit and a sensor unit. The control unit is adapted for receiving sensor data from the sensor unit. Furthermore, the control unit is adapted for controlling the sensor unit, for example to control the sensor installations of the sensor unit, such as lenses and/or the exposure time for taking pictures, if the sensor is a camera. The sensor unit may also comprise in exemplary embodiments a sound generating element, such as a membrane, or a temperature gauge if the sensor is a temperature sensor.

If the sensor is a camera and the sensor unit is an optical unit, the optical unit comprises installations for taking pictures. Specifically, the installations are lenses or a lens system and for example LED units for receiving light beams and taking pictures, respectively. The optical unit may comprise an image sensor, such as an active-pixel sensor (APS), consisting of an integrated circuit containing an array of pixel sensors, each pixel containing a photodetector and an active amplifier. An (active pixel) image sensor is for example a CMOS (Complementary metal-oxide-semiconductor) APS. Furthermore, the image sensor may be based on charge-coupled device (CCD) technology. By the CCD image sensor, pixels are represented by p-doped MOS capacitors. These capacitors are biased above the threshold for inversion when image acquisition begins, allowing the conversion of incoming photons into electron charges at a semiconductor-oxide interface of the optical unit. The CCD image sensor is then used to read out these charges.

However, in an exemplary embodiment, the sensor system may function as a distance/position system, a speed sensor system, a location/parking sensor system, a color sensor system (colorimeter), an infrared sensor, a heat sensor/flame detector, an optical position sensor (for e.g. virtual reality devices), a pressure sensor/level sensor, a proximity sensor/motion detector and/or a gesture sensor/face detection sensor.

Furthermore, the sensor system and in particular its embedded sensor unit may also be a light emitting device like an LED system, flash light or a mini projector.

According to the present invention, at least the part of the sensor unit is located within the component carrier. At least a part of the sensor unit describes that at least one third, half or the complete sensor unit is located and embedded within the component carrier. For example, the sensor unit comprises a specific height, wherein at least ⅓ of the overall height, ½ of the overall height or ⅔ of the overall height are located and embedded within the component carrier and only the rest of the respective height protrudes from an outer surface of the component carrier into the environment/atmosphere. Specifically, the complete sensor unit is embedded and located within the component carrier, so that no fraction or part of the sensor unit protrudes from the outer surface of the component carrier. Stability and reliability of the sensor system can be improved, in particular since the sensor module, such as a camera module, is protected also from a lateral side.

Hence, by locating the sensor unit at least partially within the component carrier, the risk of damage caused by outer impacts is reduced, because the height of the protruding parts protruding from the outer surface is reduced due to the location of the part of the sensor unit within the component carrier. Hence, a more robust sensor system is achieved. Furthermore, the sensor system architecture provides an efficient electromagnetic shielding and also a compact packaging technology within the component carrier.

Summarizing, by the present invention, the sensor system forms a comprehensive sensor module embedded in a component carrier, such as the PCB. Hence, a completely and fully embedded sensor system (e.g. a camera board) with a sensor system protected from at least some or all sides is presented, so that the very high reliability and the reduced height of the complete sensor system is achieved. Furthermore, the signals from the sensor unit may be directly rooted from the sensor unit to the control unit and other driver or controller chips. By the present invention, the sensor can sink inside of the component carrier for creating a mechanically safe surroundings to ensure no mechanical damage to the sensor in particular during production or the final use of the sensor. Furthermore, a lower height for the complete sensor system is achieved, so that a higher flexibility in designing the chassis and other mechanics around the sensor system area can be achieved.

Additionally, according to a further exemplary embodiment of the present invention, the control unit is located as well within the component carrier. Hence, by locating the control unit within the component carrier, the control unit is protected against outer impacts and a direct connection to the sensor, in particular the sensor unit, is possible. Specifically, the sensor comprises an almost zero disturbance of signals because the distance between the control unit and the sensor unit may be formed very short due to the embedding of both, the control unit and the sensor unit within the component carrier.

According to a further exemplary embodiment of the present invention, the component carrier comprises an electrically insulating layer structure, wherein the sensor unit is arranged within the electrically insulating layer structure.

According to a further exemplary embodiment of the present invention, the electrically insulating layer structure comprises a through hole, in particular a cavity, a blind hole or a stepped hole, in which the sensor unit is arranged. For example, the cavity can be produced using low CTE (coefficient of thermal expansion) prepreg. In another embodiment, a release layer may be formed on a laser stop layer (such as a copper foil), followed by formation of one or more additional layers as a build-up. Then, material of the further build-up is removed by laser processing, thereby forming a blind hole in the build-up which stops on the laser stop layer. Thereby, the cavity can be formed. Alternatively, the formation of the cavity may be accomplished by routing, punching, etc.

Hence, the sensor unit is embedded and surrounded by the protective electrically insulating layer structure and is therefore protected against outer impacts. The stepped hole comprises a narrow part with a smaller cross-section in comparison to a wider part with a larger cross-section. The wider part of the stepped hole is located below the outer surface of the component carrier and in particular the electrically insulating layer structure. By forming a stepped hole it is beneficial that in the narrow part of the stepped hole for example the electrical components of the sensor unit are arranged, wherein in the wider part larger components of the sensor unit (such as a lens system of an optical (sensor)) unit may be arranged. Hence, e.g. the lens system comprises a wide angled receiving window for the light beams generating a respective image, because edges of the outer surface surrounding the wider part of the stepped borehole have a larger distance to the lens system.

Specifically, forming the through hole, in particular the stepped hole, in the electrically insulating layer structure, in which the sensor unit is located, may be accomplished by mechanical drilling or laser drilling.

According to a further exemplary embodiment of the present invention, the component carrier comprises a further electrically insulating layer structure onto which the electrically insulating layer structure is arranged.

In particular, according to a further exemplary embodiment, the sensor controller is embedded in the further electrically insulating layer structure. Between the electrically insulating layer structure and the further electrically insulating layer structure an electrically conductive layer of the component carrier may be interposed in order to generate electrical connections between the sensor unit and the control unit or with other electrical components embedded within the component carrier. In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

It is preferred that the sensor controller/control unit is located directly below the sensor unit. More generally, it is advantageous to locate the sensor controller vertically as close as possible to the sensor unit, because this results in a high signal-to-noise ratio.

In order to efficiently suppress any tendency of warpage, it is possible to use material having a sufficiently low coefficient of thermal expansion, in particular for the one or more electrically insulating layer structures. One example of a prepreg material which is particularly appropriate for the one or more electrically insulating layer structures is TD002.

The component carrier comprises or consists for example of a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further electronic components and being nevertheless very thin and compact. The term "layer structure" may particularly denote a continuous layer, a patterned layer or a plurality of non-consecutive islands within a common plane.

According to a further exemplary embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with a supra-conductive material such as graphene.

According to a further exemplary embodiment, the sensor unit comprises a contact surface onto which at least one sensor contact is arranged. The contact surface abuts onto the further electrically insulating layer structure. The sensor contact provides an electrical connection to other components, such as the control unit.

According to a further exemplary embodiment, the sensor unit is an optical unit comprising a lens arranged on a lens surface of the optical unit. The lens surface is arranged on an opposite surface of the optical unit with respect to the contact surface.

According to a further exemplary embodiment, the sensor controller comprises at least one control unit contact, wherein the sensor controller contact is electrically coupled to the camera contact.

According to a further exemplary embodiment, between the control unit contact and the sensor contact an anisotropic conductive film is interposed.

The anisotropic conductive film (ACF) is a lead-free and environmentally friendly adhesive interconnect system. The ACF is available e.g. in a paste form referred to as anisotropic conductive paste (ACP), and both are grouped together as anisotropic conductive adhesives (ACAs). ACAs may be used to perform a flex-to-board or flex-to-flex connections in the assembly of sensor modules, e.g. camera modules. For example, the anisotropic conductive film connects electrically the sensor contact with the control unit contact and additionally fixes by adhesive properties the sensor unit to the sensor controller and the further electrically insulating layer structure, respectively.

According to a further exemplary embodiment, the sensor unit is free of any contact with the electrically insulating layer structure. Hence, a gap is formed between the electrically insulating layer structure and the sensor unit. The gap may be filled with air or other, for example thermally conductive and transparent, materials. Hence, heat may be transferred away from the sensor unit, so that the risk of overheating is reduced. Furthermore, by fully embedding the sensor unit within the component carrier and by providing the filling the gap with transparent material, a fully mechanical cover and protection for the sensitive sensor units may be provided.

According to a further exemplary embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

According to a further exemplary embodiment, the component carrier is shaped as a plate.

In an embodiment, the component carrier is shaped as a plate. This contributes to the compact design of the electronic device, wherein the component carrier nevertheless provides a large basis for mounting electronic components thereon. Furthermore, in particular a naked die as a preferred example for an embedded electronic component, can be conveniently embedded, thanks to its small thickness, into a thin plate such as a printed circuit board.

According to a further exemplary embodiment, the component carrier is configured as one of the group consisting of a printed circuit board (PCB), and a substrate (in particular an IC substrate).

Using a PCB as the component carrier and the at least partially elastic electrically insulating layer structure, respectively, may provide the advantage that a stable and reliable electronic device may be manufactured cheaply and simply by forming the component cavity in a surface portion of a conventional PCB, e.g. in the outermost layer or in the two outermost layers of the PCB. Subsequently, the electronic component, such as the sensor system including the sensor unit and the sensor control unit, is arranged inside the component cavity. Therefore, a stable electronic device with small dimensions can be provided.

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

The term "substrate" may particularly denote a small component carrier having substantially the same size as the sensor system to be mounted therein. In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

According to a further exemplary embodiment, the component carrier is a laminate-type component carrier. In such an embodiment, the component carrier is a compound of multiple layer structures which are stacked and connected together by applying a pressing force, if desired accompanied by heat.

According to yet another exemplary embodiment, the sensor system further comprises an optically transparent cover hermetically sealing at least the sensor, in particular the camera. This protects the sensor while allowing electromagnetic radiation such as light from propagating between an interior and an exterior of the sensor system.

In a further embodiment, one or more further electronic components may be embedded in the sensor system. The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as components.

DETAILED DESCRIPTION OF ILLUSTRATED EMBODIMENTS

Figure 1:
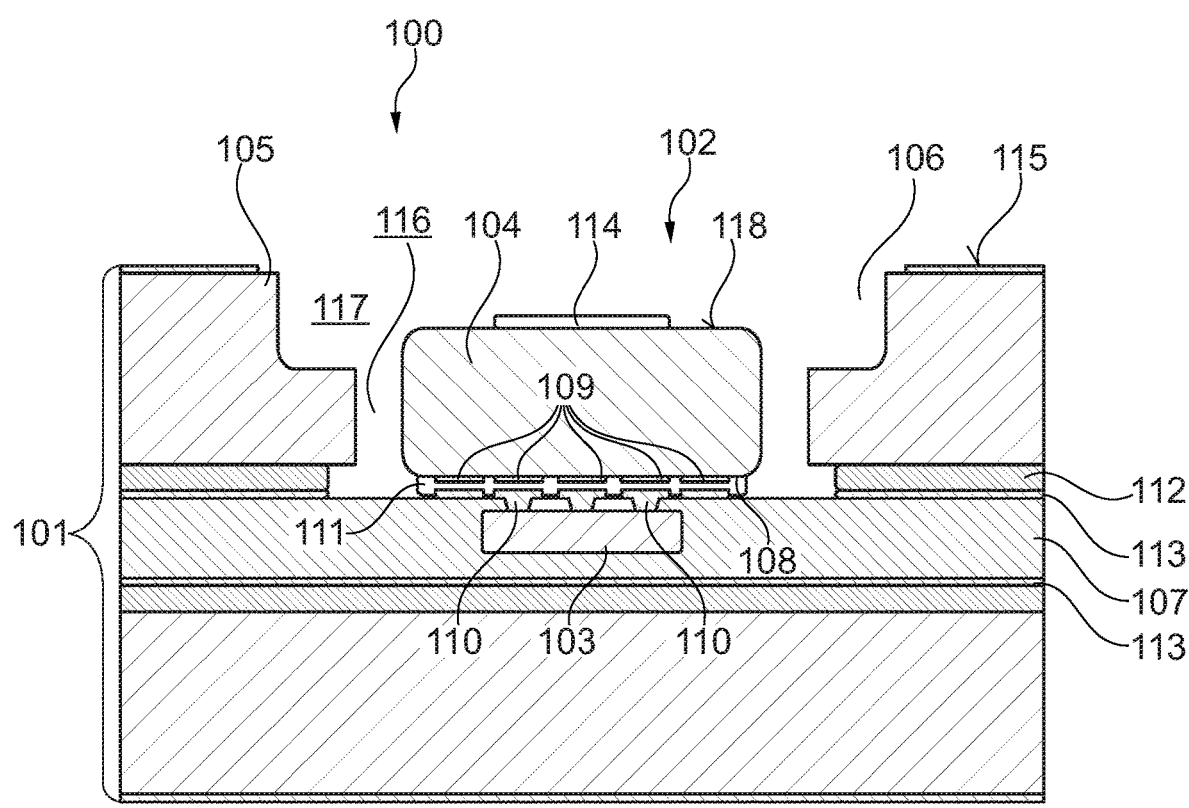
FIG. 1 shows a schematic view of a sensor system, in particular a camera system, according to an exemplary embodiment of the present invention.

The aspects defined above and further aspects of the invention are apparent from the examples of embodiment to be described hereinafter and are explained with reference to these examples of embodiment.

The invention will be described in more detail hereinafter with reference to examples of embodiment but to which the invention is not limited.

The illustrations in the drawings are schematically presented. In different drawings, similar or identical elements are provided with the same reference signs.

FIG. 1 shows a sensor system 100, in particular a camera system, according to an exemplary embodiment of the present invention. The sensor system 100 (e.g. the camera system) comprises a component carrier 101 and a sensor 102 (e.g. a camera) having a control unit 103 and a sensor unit 104 (e.g. an optical sensor). At least a part of the sensor unit 104 is located within the component carrier 101.

The component carrier 101 forms a support structure which is capable of accommodating one or more electronic components, in particular the described sensor 102, thereon and/or therein for providing both mechanical support and electrical connectivity.

The sensor 102 comprises the control unit 103 and a sensor unit 104. The control unit 103 is adapted for receiving data, e.g. optical data, from the sensor unit 104 (e.g. the optical sensor). Furthermore, the control unit 103 is adapted for controlling the sensor unit 104, for example to control the optical installations, such as lenses 114, and/or the exposure time for taking pictures. The sensor unit 104 comprises e.g. installations for taking pictures if the sensor system 100 is a camera system and the sensor unit 104 is an optical unit. The optical unit 104 may comprise an image sensor, such as an active-pixel sensor (APS), consisting of an integrated circuit containing an array of pixel sensors, each pixel containing a photodetector and an active amplifier.

As can be taken from FIG. 1, the sensor unit 104 is located within the component carrier 101, so that no fraction or part of the sensor unit 104 protrudes from the outer surface 115 of the component carrier 101.

By locating the sensor unit 104 within the component carrier 101, the risk of damage caused by outer impacts is reduced, because the height of the protruding parts protruding from the outer surface is reduced due to the location of the part of the sensor unit 104 within the component carrier 101. Hence, a more robust sensor system 100 is achieved.

The control unit 103 is located as well within the component carrier 101.

As can be taken from FIG. 1, the component carrier 101 comprises an electrically insulating layer structure 105, wherein the sensor unit 104 is arranged within the electrically insulating layer structure 105.

Specifically, the electrically insulating layer structure 105 comprises a through hole 106, in particular a stepped hole, in which the sensor unit 104 is arranged.

Hence, the sensor unit 104 is embedded and surrounded by the protective electrically insulating layer structure 105 and is therefore protected against outer impacts. The stepped hole comprises a narrow part 116 with a smaller cross-section in comparison to a wider part 117 with a larger cross-section. The wider part 117 of the stepped hole 106 is located below the outer surface 115 of the component carrier 101 and in particular the electrically insulating layer structure 105. By forming a stepped hole 106 it is beneficial that in the narrow part 116 of the stepped hole 106 for example the electrical components of the sensor unit 104 are arranged, wherein in the wider part 117 installations of the sensor system 100 (e.g. a camera system), such as a lens system 114 of the optical unit 104, are arranged. Hence, the lens 114 comprises a wide angled receiving window (formed by the wider part 117) for the light beams generating a respective image, because edges of the outer surface 115 surrounding the wider part 117 of the stepped borehole 106 have a larger distance to the lens 114.

The component carrier 101 comprises a further electrically insulating layer structure 107 onto which the electrically insulating layer structure 105 is arranged.

In particular, according to a further exemplary embodiment, the sensor controller 103 is embedded in the further electrically insulating layer structure 107. Between the electrically insulating layer structure 105 and the further electrically insulating layer structure 107 an electrically conductive layer 113 of the component carrier 101 may be interposed in order to generate electrical connections between the sensor unit 104 and the control unit 103 or with other electrical components (not shown) embedded within the component carrier. Furthermore, between the electrically conductive layer 113 and the electrically insulating layer structure 105 a further layer made of a low flow prepreg 112 may be arranged.

The sensor unit 104 comprises a contact surface 108 onto which at least one sensor contact 109 is arranged. The contact surface 108 abuts onto the further electrically insulating layer structure 107. The sensor contact 109 provides an electrical connection to other components, such as the control unit 103.

The sensor unit 104 comprises the lens 114 arranged on a lens surface 118 of the sensor unit 104. The lens surface 118 is arranged on an opposite surface of the sensor unit 104 with respect to the contact surface 108.

Accordingly, the sensor controller 103 comprises at least one control unit contact 110, wherein the sensor controller contact 110 is electrically coupled to the sensor contact 109.

Between the control unit contact 110 and the sensor contact 109 an anisotropic conductive film 111 is interposed. The anisotropic conductive film (ACF) 111 is a lead-free and environmentally friendly adhesive interconnect system. The anisotropic conductive film 111 connects electrically the sensor contact 109 with the control unit contact 110 and additionally fixes by adhesive properties the sensor unit 104 to the sensor controller 103 and the further electrically insulating layer structure 107, respectively.

The sensor unit 104 is free of any contact with the electrically insulating layer structure 105. Hence, a gap is formed between the electrically insulating layer structure 105 and the sensor unit 104. The gap may be filled with air or other, for example thermally conductive, materials. Hence, heat may be transferred away from the sensor unit 104, so that the risk of overheating is reduced.

In the following, and exemplary manufacturing method of the sensor system 100 is described.

Figure 2:
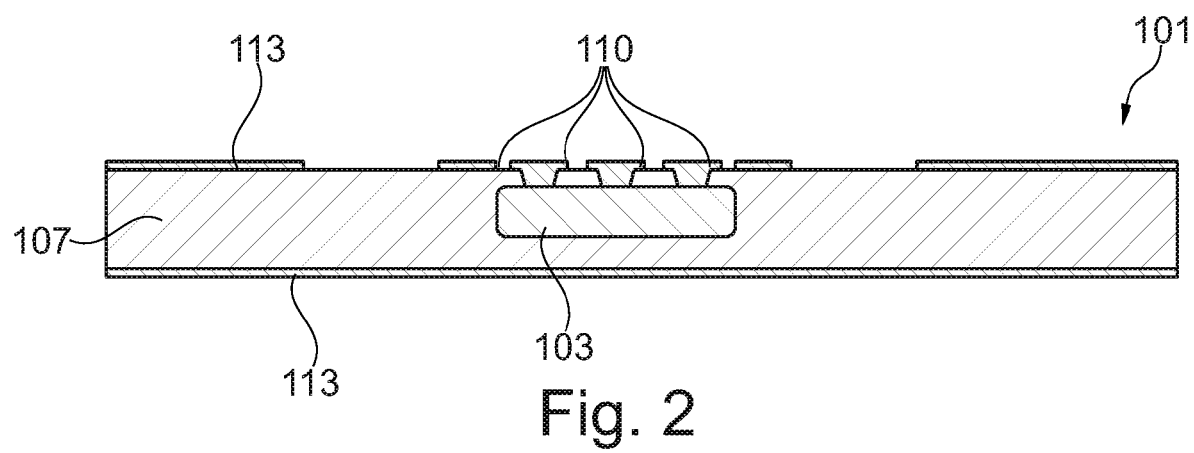
FIG. 2, FIG. 3, FIG. 4, FIG. 5 and FIG. 6 show schematic views of intermediate products of the sensor system illustrating a method of manufacturing the sensor system according to an exemplary embodiment of the present invention.

As can be taken from FIG. 2, the component carrier 101 is provided. The component carrier 101 includes the embedded control unit 103. Specifically, the further electrically insulating layer structure 107 is provided in which the control unit 103 is embedded.

Along a top surface and a bottom surface of the further electrically insulating layer structure 107 respective electrically conductive layers 113 are formed. The electrically conductive layer 113 at the top surface of the further electrically insulating layer structure 107 is adapted e.g. by etching methods, so that respective control unit contact 110 are formed which are electrically coupled to the sensor controller 103.

Figure 3:
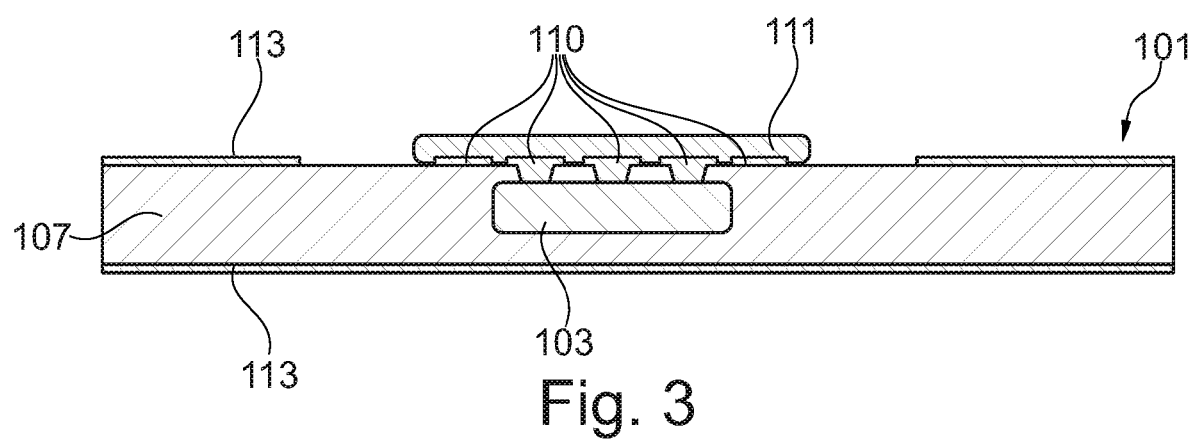

As can be taken from FIG. 3, in a next step the anisotropic conductive film (ACF) 111 is applied to a contact area of the further electrically insulating layer structure 107, so that the ACF covers the control unit contacts 110. The contact area of the further electrically insulating layer structure 107 describes the area onto which the sensor unit 104 is arranged later on.

Figure 4:
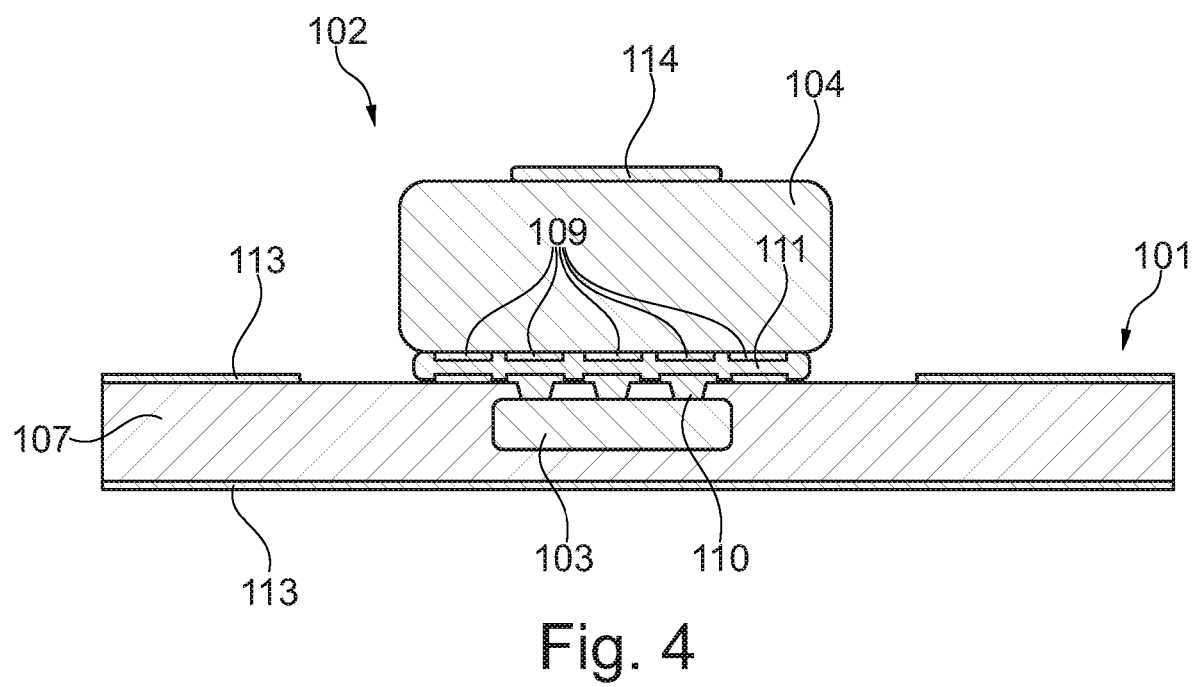

As can be taken from FIG. 4, the sensor unit 104 functioning e.g. as optical sensor comprising the lens 114 and the sensor contact 109 are arranged onto the contact area. The ACF is treated for example thermally, such that an adhesive bond between the sensor unit 104 and the control unit 103 is generated. Furthermore, the electrically connections between the camera contact 109 and the control unit contact 110 are formed by the ACF.

Figure 5:
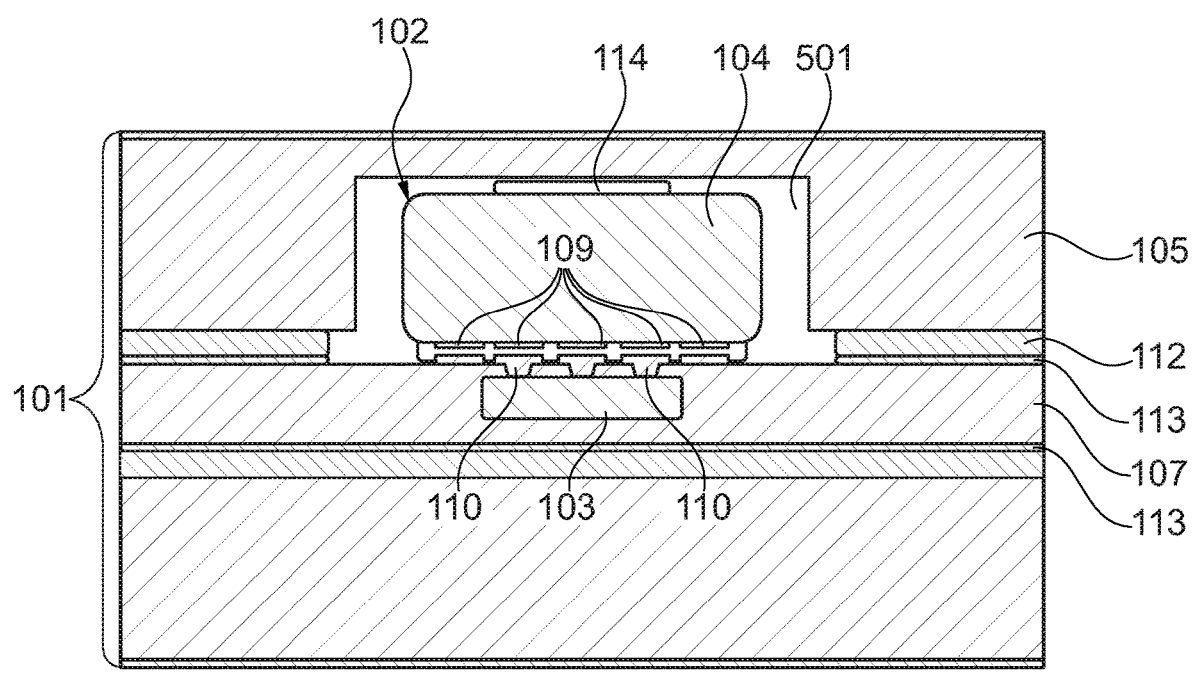

As can be taken from FIG. 5, a further layer is arranged onto the further electrically insulating layer structure 107 and in particular onto the upper electrically conductive layer 113. Specifically, the further layer is made of a low flow prepreg 112. Hence, by using the low flow prepreg 112, the risk of climbing of the low flow prepreg 112 (resin) up to installation of the sensor unit, such as the camera lens 114, during the manufacturing process is reduced.

Next, the electrically insulating layer structure 105 is arranged onto the upper surface of the low flow prepreg layer 112. The electrically insulating layer structure 105 comprises a recess 501 in which the sensor unit 104 comprising the lens 114 is housed and embedded.

Figure 6:
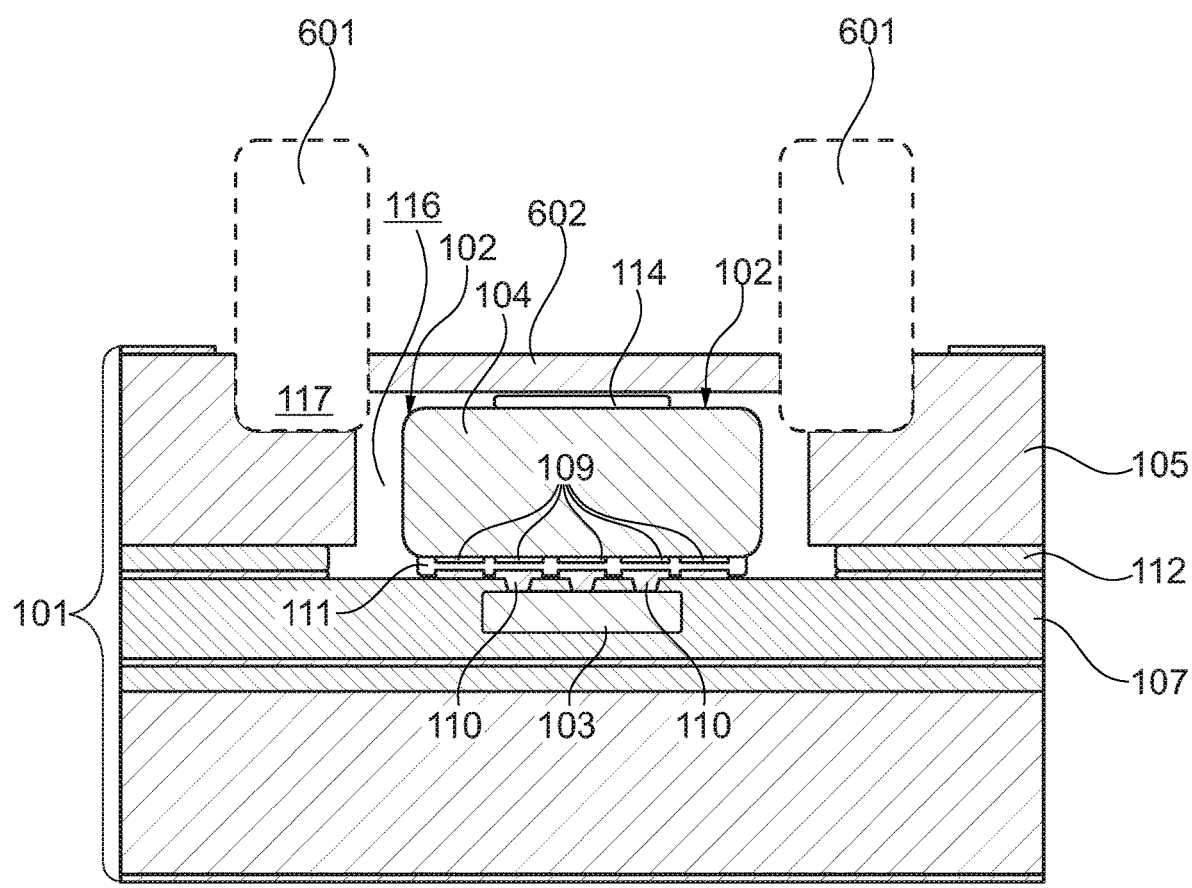

As can be taken from FIG. 6, the electrically insulating layer structure 105 is penetrated by a depth routing procedure 601 and/or by a drilling procedure, such that the wider part 117 of the through hole 106 is formed.

Specifically, the forming of the wider part 117 of the through hole 106 generates a cap 602 which is separated from the surrounding electrically insulating layer structure 105. Hence, in a next step, the cap 602 is removed such that the lens 114 is adapted for receiving light beams from the environment surrounding the electrically insulating layer structure 105. After the step of removing the cap 602, the exemplary embodiment of the sensor system 100 as shown in FIG. 1 is manufactured.

It should be noted that the term "comprising" does not exclude other elements or steps and the "a" or "an" does not exclude a plurality. Also elements described in association with different embodiments may be combined. Implementation of the invention is not limited to the preferred embodiments shown in the figures and described above. Instead, a multiplicity of variants are possible which use the solutions shown and the principle according to the invention even in the case of fundamentally different embodiments.

REFERENCE SIGNS 100 sensor system
101 component carrier
102 sensor/camera
103 control unit
104 sensor unit/optical unit
105 electrically insulating layer structure
106 through hole
107 further electrically insulating layer structure
108 contact surface
109 sensor contact
110 control unit contact
111 anisotropic conductive film
112 low flow prepreg
113 electrically conductive layer
114 lens
115 outer surface
116 narrow part of through hole
117 wider part of through hole
118 lens surface
501 recess
601 depth routing
602 cap

The invention claimed is:
1. A sensor system, comprising:
a laminate-type component carrier including multiple layer structures stacked and connected together for forming a printed circuited board;
a sensor device having a control unit and a sensor unit;
wherein the control unit is embedded in an electrically insulating layer structure of the multiple layer structures of the printed circuit board;
wherein the control unit is in direct contact with the electrically insulating layer structure of the printed circuit board;
wherein the sensor unit is located within a cavity formed in a further electrically insulating layer structure of the multiple layer structures of the printed circuit board,
wherein the further electrically insulating layer structure is adjacent to a surface of the electrically insulating layer structure, and
wherein the sensor unit comprises a contact surface onto which a sensor contact is arranged,
wherein the contact surface is adjacent to the surface of the electrically insulating layer structure.

2. The sensor system according to claim 1,
wherein the further electrically insulating layer structure forms a cavity, in which the sensor unit is arranged.

3. The sensor system according to claim 2,
wherein a surface of the further electrically insulating layer structure defines first and second portions of the cavity.

4. The sensor system according to claim 3,
wherein the further electrically insulating layer structure is supported by the multiple layer structures.

5. The sensor system according to claim 1,
wherein the sensor device is a camera and the sensor unit is an optical unit comprising a lens arranged on a lens surface of the optical unit,
wherein the lens surface is arranged on an opposite surface of the optical unit with respect to the contact surface.

6. The sensor system according to claim 1 wherein the control unit comprises a control unit contact, wherein the control unit contact is electrically coupled to the sensor contact, wherein between the control unit contact and the sensor contact an anisotropic conductive film is interposed.

7. The sensor system according to claim 1,
wherein the sensor unit is free of any contact with the further electrically insulating layer structure.

8. The sensor system according to claim 1, further comprising: a component selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip; an electrically conductive layer structure, wherein the at least one electrically conductive layer structure includes a material selected from the group consisting of copper, aluminum, nickel, silver, gold, palladium, and tungsten.

9. The sensor system according to claim 1, wherein the electrically insulating layer structure includes a material selected from the group consisting of resin, Bismaleimide-Triazine resin, cyanate ester, glass, glass fibers, prepper material, polyimide, liquid crystal polymer, epoxy-based Build-Up Film, FR4 material, a ceramic, and a metal oxide.

10. The sensor system according to claim 1,
wherein the component carrier is shaped as a plate,
wherein the component carrier is a substrate.

11. The sensor system according to claim 1, further comprising: an optically transparent cover hermetically sealing the sensor.

12. A method of manufacturing a sensor system, the method comprising:
providing a laminate-type component carrier having multiple layer structures which are stacked and connected together to form a printed circuit board;
providing a sensor having a control unit and a sensor unit;
embedding the control unit in an electrically insulating layer structure of the multiple layer structures of the printed circuit board;
adding a further electrically insulating layer structure adjacent to a surface of the electrically insulating layer structure, the further electrically insulating structure defining a cavity;
arranging the sensor unit in the cavity, wherein the control unit is in direct contact with the electrically insulating layer structure,
wherein the sensor unit comprises a contact surface onto which a sensor contact is arranged,
wherein the contact surface is adjacent to the surface of the electrically insulating layer structure.

13. The method according to claim 12,
wherein locating includes adding a further electrically insulating layer structure to the multiple layer structures, the further electrically insulating structure defining a cavity arranged to surround the sensor unit.

14. The method according to claim 12,
applying a conductive film to a contact area of the control unit;
arranging a contact surface of the sensor unit on the conductive film; and
treating the conductive film to electrically bond the sensor unit to the control unit.

15. The method according to claim 14,
applying a flowable material on the multiple layer structures of the laminate-type component carrier, and
arranging a further electrically insulating layer structure onto the flowable material.

16. The method according to claim 15, further comprising:
arranging a lens on a lens surface of the sensor unit, wherein the lens surface is arranged on an opposite surface of the sensor unit with respect to the contact surface.

17. The method according to claim 15,
wherein the flowable material forms a low flow prepreg layer between the multiple layer structures and the further electrically insulating layer structure, so that the low flow prepreg layer surrounds the contact area.

* * * * *